(12) United States Patent
Wang et al.

(10) Patent No.: US 10,096,445 B1
(45) Date of Patent: Oct. 9, 2018

(54) ION SOURCE APPARATUS

(71) Applicant: BOHHEN OPTRONICS CO., LTD., Taichung (TW)

(72) Inventors: Shih-Tse Wang, Taichung (TW); Chin-Chih Tsai, Taichung (TW); Tsai-Cheng Wang, Taichung (TW)

(73) Assignee: BOHHEN OPTRONICS CO., LTD., Taichung (TW)

( * ) Notice: Subject to any disclaimer, the term of this patent is extended or adjusted under 35 U.S.C. 154(b) by 0 days.

(21) Appl. No.: 15/662,711

(22) Filed: Jul. 28, 2017

(51) Int. Cl.
*H01J 27/02* (2006.01)
*H01J 37/08* (2006.01)

(52) U.S. Cl.
CPC ............ *H01J 27/022* (2013.01); *H01J 37/08* (2013.01); *H01J 2209/017* (2013.01); *H01J 2237/022* (2013.01)

(58) Field of Classification Search
None
See application file for complete search history.

(56) References Cited

U.S. PATENT DOCUMENTS

| | | | | |
|---|---|---|---|---|
| 3,775,216 A * | 11/1973 | Frentrop | ............... | G01V 5/10 156/293 |
| 4,641,031 A * | 2/1987 | Ito | .................. | H01J 27/14 250/423 R |
| 6,963,162 B1 * | 11/2005 | Centurioni | ............ | H01J 27/022 313/231.01 |
| 7,425,711 B2 * | 9/2008 | Burtner | ............... | H01J 1/42 250/423 R |
| 7,439,521 B2 * | 10/2008 | Burtner | ............... | H01J 27/022 250/423 R |
| 7,476,869 B2 * | 1/2009 | Burtner | ............... | H01J 27/146 250/423 R |
| 9,711,341 B2 * | 7/2017 | Ramsey | ............... | H01J 49/24 |
| 2003/0230986 A1 * | 12/2003 | Horsky | ................ | C23C 14/48 315/111.81 |
| 2007/0125966 A1 * | 6/2007 | Burtner | ............... | H01J 27/022 250/492.21 |
| 2007/0278417 A1 * | 12/2007 | Horsky | ................ | H01J 27/205 250/427 |

* cited by examiner

*Primary Examiner* — Andrew Smyth
(74) *Attorney, Agent, or Firm* — Osha Liang LLP

(57) ABSTRACT

An ion source apparatus has a body, a heat dissipating base, at least two supporting shafts, a guiding block, and a shunt. The body has a holding chamber formed inside the body. The heat dissipating base is located in the holding chamber of the body. The at least two supporting shafts are mounted through the heat dissipating base. The guiding block is mounted on the at least two supporting shafts, and is a hollow circular block. The shunt is located at a center of a top surface of the heat dissipating base, and is located below the mounting hole of the guiding block.

8 Claims, 6 Drawing Sheets

ION SOURCE APPARATUS

BACKGROUND OF THE INVENTION

1. Field of the Invention

The present invention relates to an ion source apparatus, and more particularly to an ion source apparatus which is convenient to be cleaned to keep particles from generating and to drastically reduce the chances of short circuits.

2. Description of Related Art

A conventional ion source apparatus is widely used in the ion plating technology which is applied to products of optoelectronics, such as a cold-mirror surveillance system, an image IR-cut, a reticle mask, a UV-IR-CUT, a R.GB-AR and filters or the like.

With reference to FIG. 6, the conventional ion source apparatus has a body 70, a heat dissipating base 80, and a guiding block 90. The body 70 is cylindrical and has a holding chamber 71, a base element 72, and an assembling element 73. The holding chamber 71 is formed in the body. The holding chamber 71 has an opening 711, the opening 711 is formed through a top of the body 70, and positive ions may be emitted from the opening 711. The base element 72 is a circular disk, and is mounted in the body 70. The assembling element 73 is also a circular disk, and is mounted on a top surface of the base element 72. The heat dissipating base 80 is mounted inside the holding chamber 71 of the body 70, and has a transmitting element 81, a first heat dissipating plate 82, and a second heat dissipating plate 83. The transmitting element 81 is made of ceramics, and is a circular disk. The first heat dissipating plate 82 is located under the transmitting element 81, and is an annular plate. The second heat dissipating plate 83 is located on a top surface of the transmitting element 81. The first heat dissipating plate 82 and the second heat dissipating plate 83 are made of graphite. The guiding block 90 is a circular hollow block, and is mounted on a top surface of the second heat dissipating plate 83. The guiding block 90 is combined with the heat dissipating base 80, the assembling element 73, and the base element 72 with two bolts 91.

The emitted positive ions would fall on the second heat dissipating plate 83 after long term use of the conventional ion source apparatus, and this causes a short circuit of the second heat dissipating plate 83. Therefore, the second heat dissipating plate 83 has to be cleaned frequently. To clean the second heat dissipating plate 83 is inconvenient since the guiding block 90 is combined with the heat dissipating base 80 by the bolts 91. In addition, the second heat dissipating plate 83 is made of graphite, and the process of combining the guiding block 90 and the second heat dissipating plate 83 would generate particles. Therefore, to clean the particles on the second heat dissipating plate 83 is inconvenient.

To overcome the shortcomings of the conventional ion source apparatus, the present invention provides an ion source apparatus to mitigate or obviate the aforementioned problems.

SUMMARY OF THE INVENTION

The present invention relates to an ion source apparatus, and more particularly to an ion source apparatus that is convenient to clean, and the particles are not easily generated, and the chances of short circuits are drastically reduced.

The ion source apparatus has a body, a heat dissipating base, at least two supporting shafts, a guiding block, and a shunt. The body has a holding chamber formed inside the body. The heat dissipating base is located in the holding chamber of the body. The at least two supporting shafts are mounted through the heat dissipating base. The guiding block is mounted on the at least two supporting shafts, and is a hollow circular block. The shunt is located at a center of a top surface of the heat dissipating base, and is located below the mounting hole of the guiding block.

Other objects, advantages, and novel features of the invention will become more apparent from the following detailed description when taken in conjunction with the accompanying drawings.

DETAILED DESCRIPTION OF PREFERRED EMBODIMENT

Figure 1:
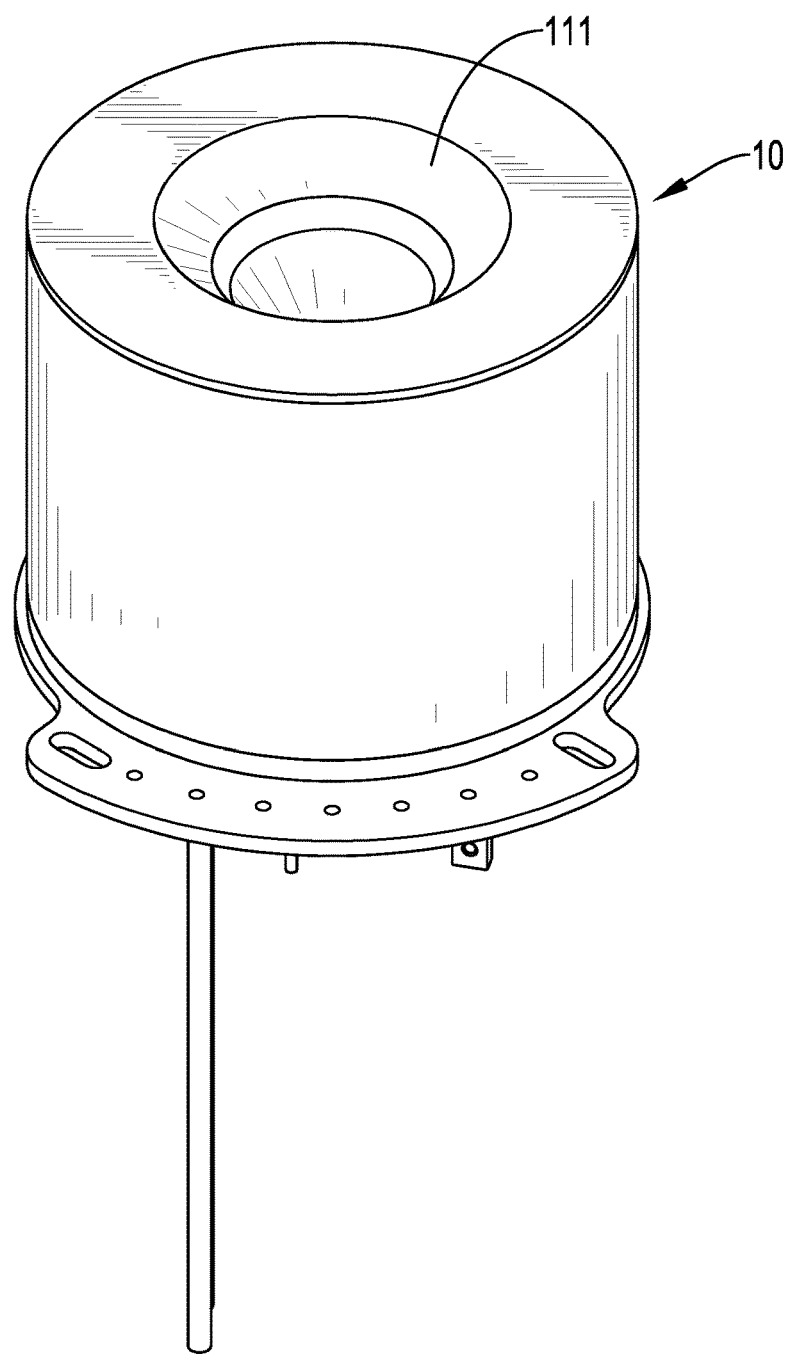
FIG. 1 is a perspective view of an ion source apparatus in accordance with the present invention.
Figure 2:
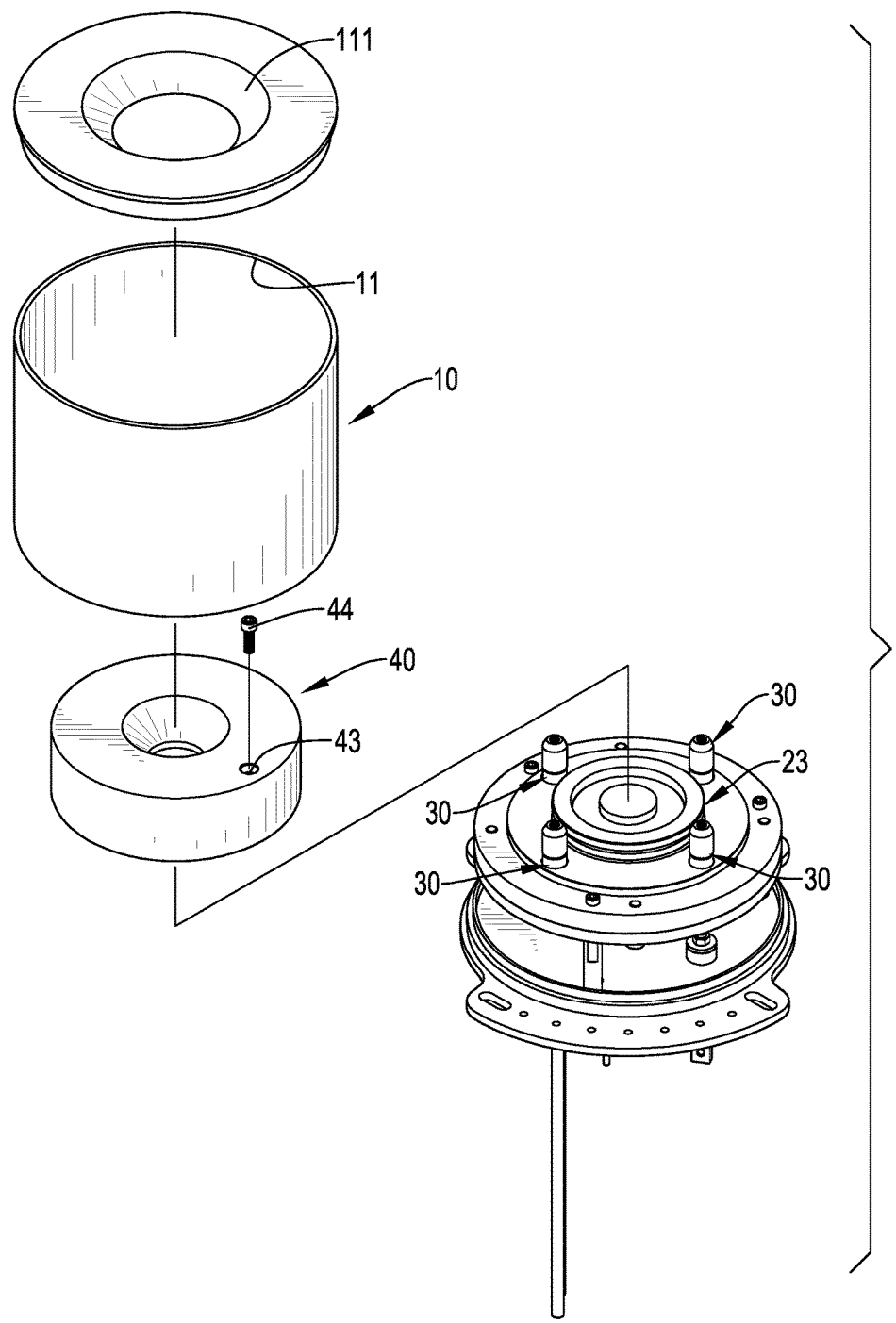
FIG. 2 is an exploded perspective view of the ion source apparatus in FIG. 1.
Figure 3:
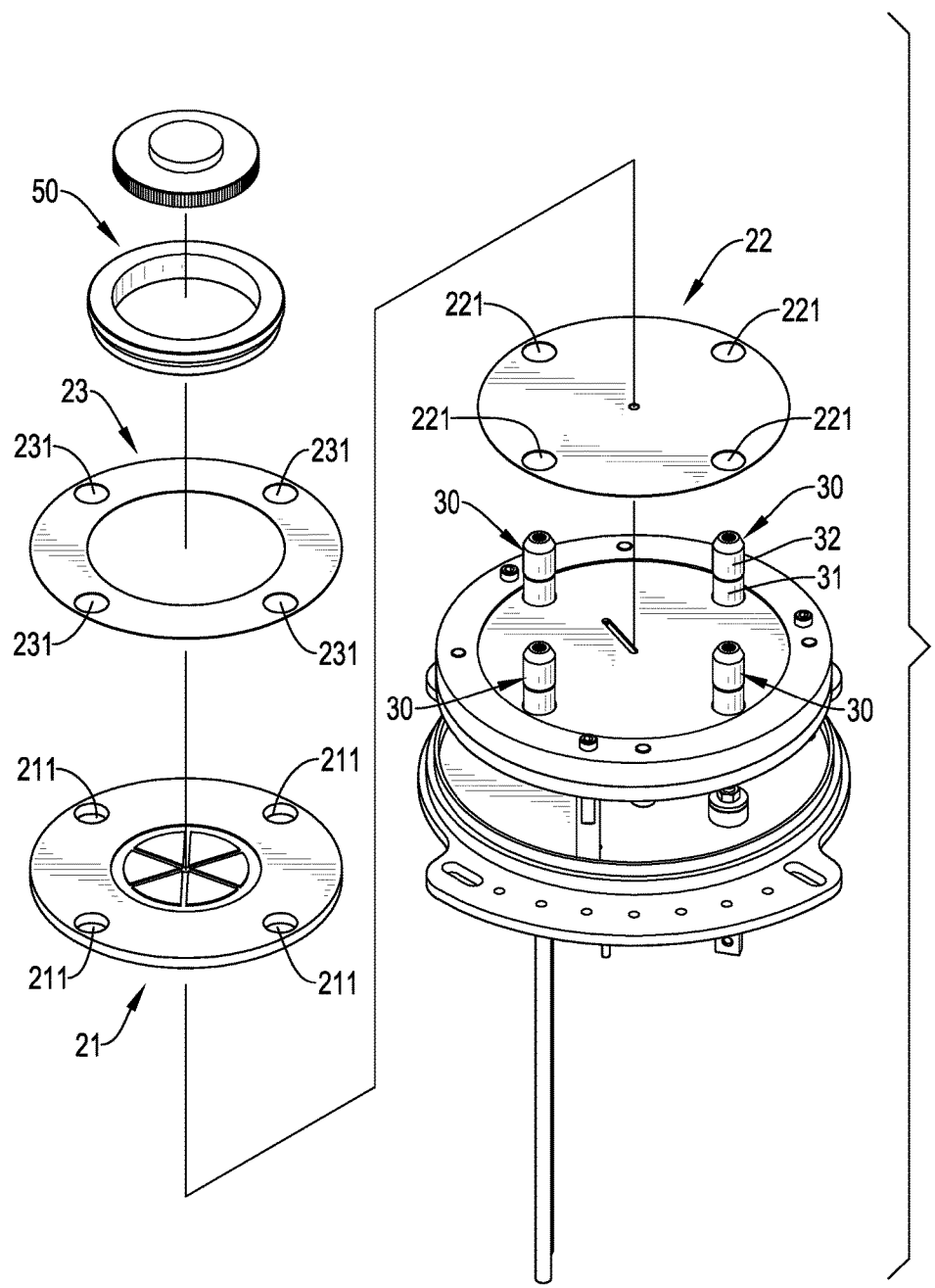
FIG. 3 is another exploded perspective view of the ion source apparatus in FIG. 1.

With reference to FIGS. 1 to 3, an ion source apparatus in accordance with the present invention comprises a body 10, a heat dissipating base 20, at least two supporting shafts 30, a guiding block 40, and a shunt 50.

Figures 4A, 4B:
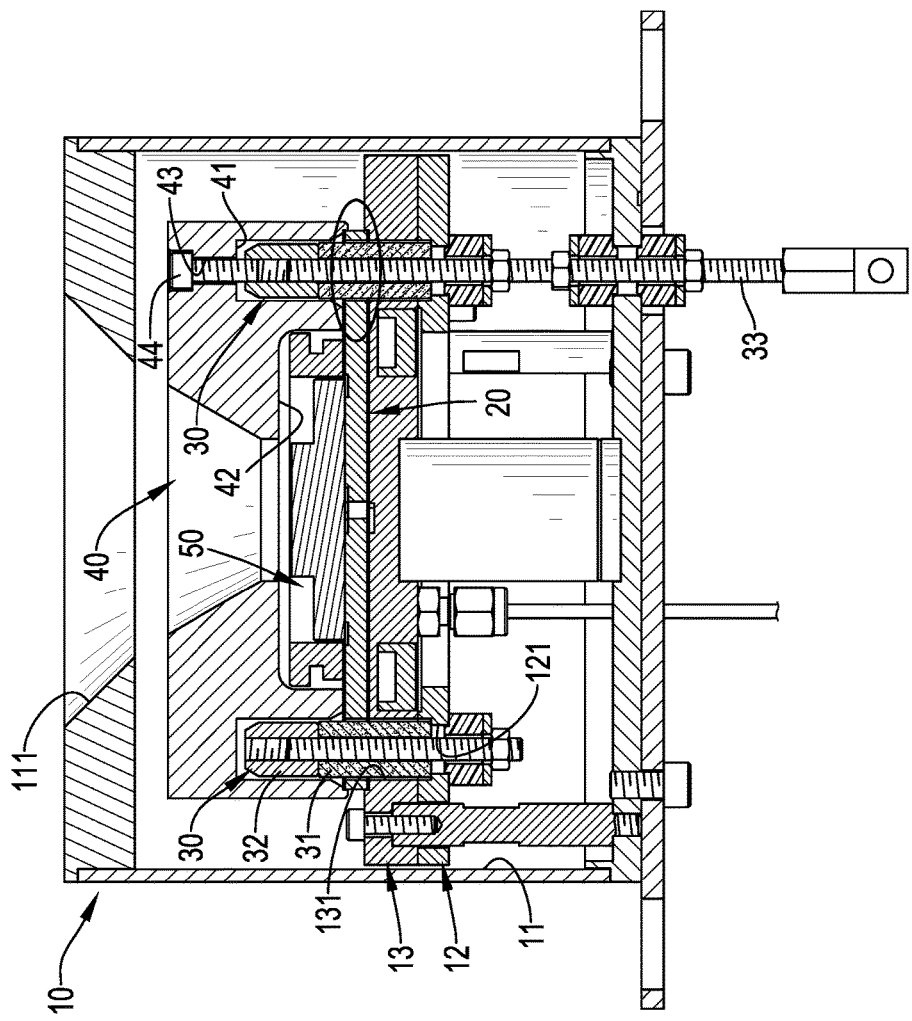
FIG. 4A is a side view in partial section of the ion source apparatus in FIG. 1.
FIG. 4B is an enlarged side view in partial section of the ion source apparatus in FIG. 1.
Figure 5:
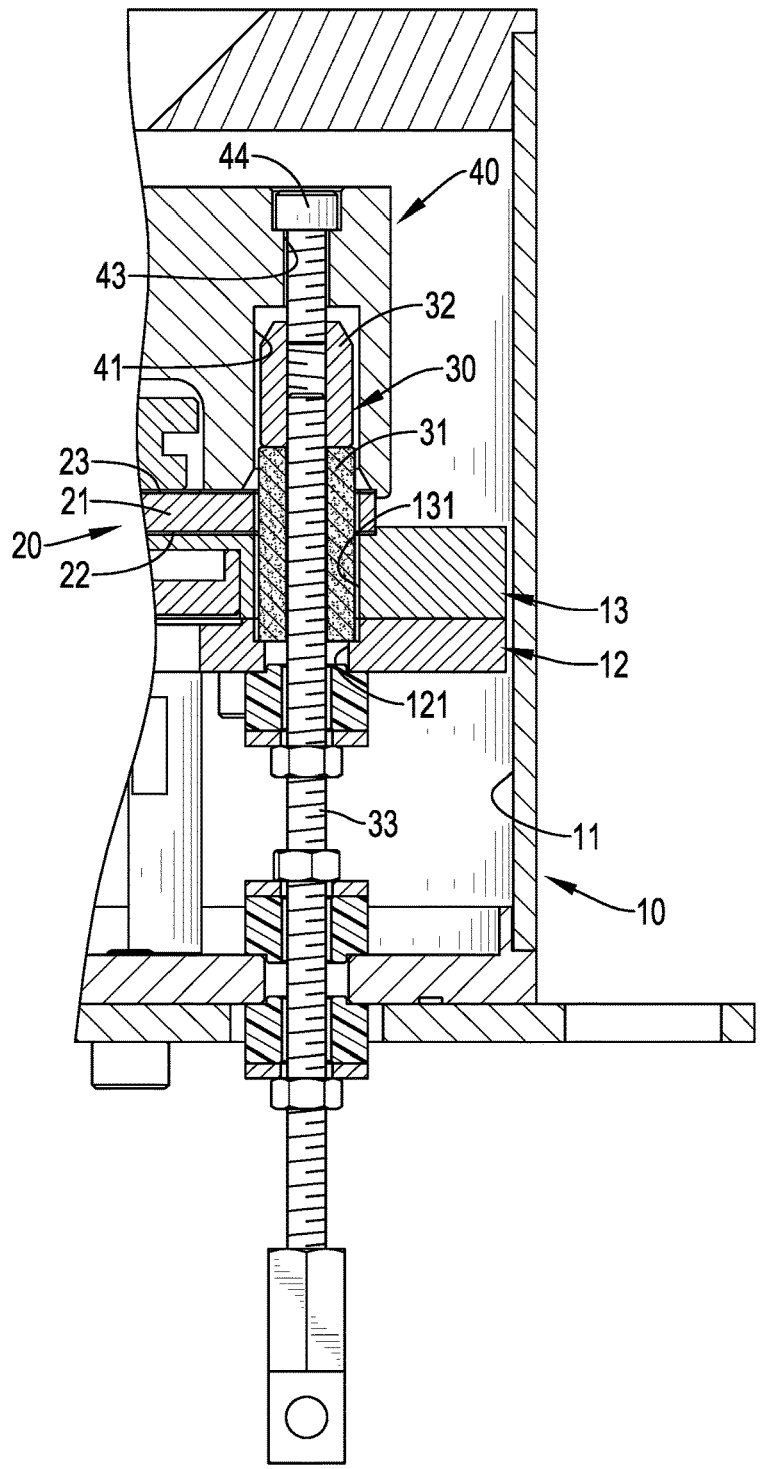
FIG. 5 is an enlarged side view in partial section of the ion source apparatus in FIG. 1.
Figure 6:
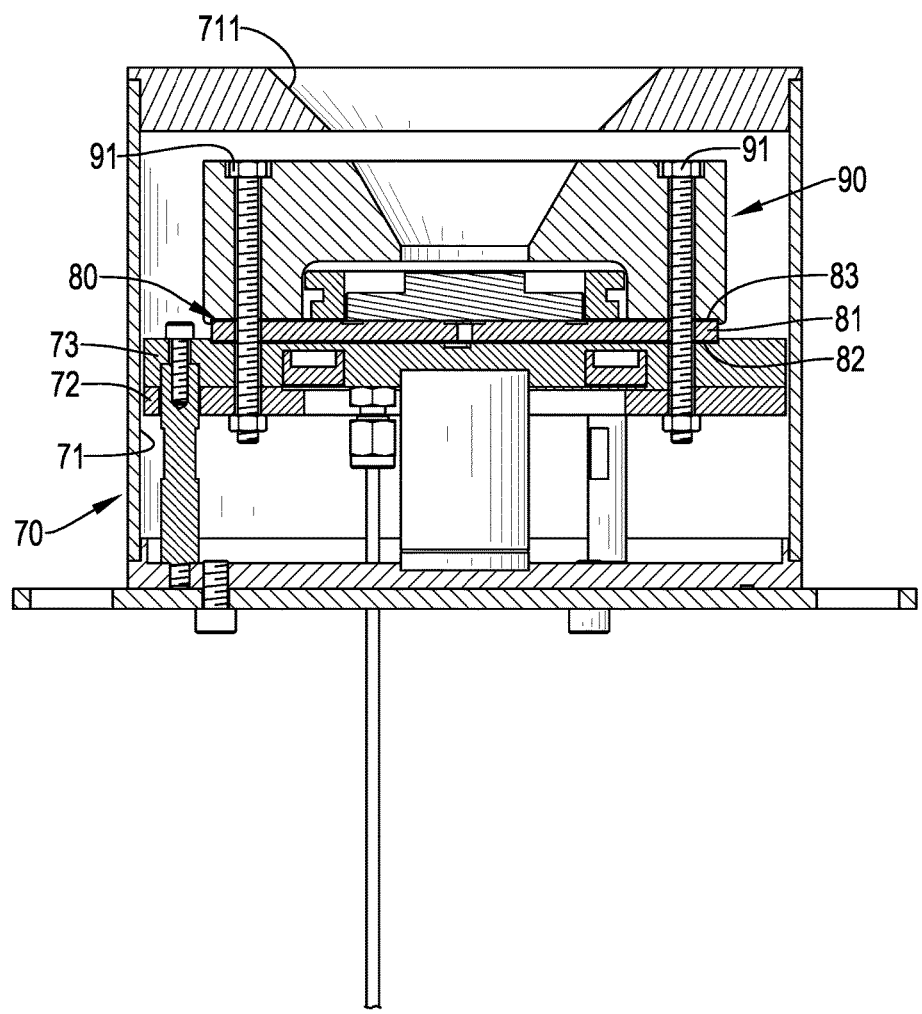
FIG. 6 is a side view in partial section of a conventional ion source apparatus.

With further reference to FIGS. 4A and 4B, the body 10 is cylindrical and has an opening 111, a holding chamber 11, a base element 12, and an assembling element 13. The opening 111 is formed through a top of the body 10. Therefore, positive ions may be emitted upward from the opening 111. The holding chamber 11 is formed inside the body 10 and communicates with the opening 111 of the body 10. The base element 12 is located inside the holding chamber 11, and is an annular disk. The base element 12 has at least two through holes 121 formed through the base element 12 at spaced intervals. The assembling element 13 is mounted on a top surface of the base element 12 and has at least two assembling holes 131. The assembling element 13 is also an annular disk. The at least two assembling holes 131 are formed through the assembling element 13 at spaced intervals.

The heat dissipating base 20 is located in the holding chamber 11 of the body 10, and is mounted on a top surface of the assembling element 13. The heat dissipating base 20 has a transmitting element 21, a first heat dissipating plate 22, and a second heat dissipating plate 23. The transmitting element 21 is mounted in the holding chamber 11 and is a circular disk. The transmitting element 21 is made of ceramics. The transmitting element 21 has at least two guiding holes 211 formed through the transmitting element 21 at spaced intervals. The first heat dissipating plate 22 is located under the transmitting element 21 and is an annular disk. The first heat dissipating plate 22 has at least two bottom holes 221 formed through the first heat dissipating plate 22 at spaced intervals. The at least two bottom holes 221 are located respectively below the at least two guiding holes 211. The second heat dissipating plate 23 is mounted on a top surface of the transmitting element 21 and is an annular disk. The second heat dissipating plate 23 has at least two top holes 231 formed through the second heat dissipating plate 23 at spaced intervals. The at least two top holes 231 are located respectively above the at least two guiding holes 211. The first heat dissipating plate 22 and the second heat dissipating plate 23 are made of graphite.

The at least two supporting shafts 30 are respectively mounted through the at least two through holes 121 of the base element 12, the at least two assembling holes 131 of the assembling element 13, the at least two guiding holes 211 of the transmitting element 21, and the at least two top holes 231 of the second heat dissipating plate 23. Each one of the at least two supporting shafts 30 has a base portion 31, an abutting portion 32, and a guiding wire 33. The base portion 31 is made of ceramics, and the abutting portion 32 is made of copper. The abutting portion 32 abuts a top surface of the base portion 31, and the abutting portion 32 of each supporting shaft 30 extends out of a top surface of the second heat dissipating plate 23. The guiding wire 33 is mounted at a bottom portion of the supporting shaft 30.

The guiding block 40 is mounted on the at least two supporting shafts 30 and is a hollow circular block. The guiding block 40 has at least two mounting holes 41, a mounting recess 42, and a locking hole 43. The at least two mounting holes 41 are formed in a bottom surface of the guiding block 40. The positions of the at least two mounting holes 41 correspond to the positions of the at least two supporting shafts 30 respectively. The mounting recess 42 is formed in a center of the bottom surface of the guiding block 40. The locking hole 43 is formed through a top surface of the guiding block 40 and communicates with one of the at least two mounting holes 41. A bolt 44 is mounted through the locking hole 43 and is screwed with the abutting portion 32 of one of the at least two supporting shafts 30. The shunt 50 is located at a center of the top surface of the second heat dissipating plate 23, and is held in the mounting recess 42 of the guiding block 40.

With reference to FIGS. 2 to 4, when the ion source apparatus in accordance with the present invention is in use, the guiding block 40 is directly mounted on the at least two supporting shafts 30. The guiding block 40 is connected with the heat dissipating base 20 without screwing engagement except for the bolt 44 screwed with one of the at least two supporting shafts 30. When the ion source apparatus is cleaned, the guiding block 40, the second heat dissipating plate 23, the transmitting element 21, and the first heat dissipating plate 22 can be easily taken out of the body 10 after the bolt 44 is unscrewed. Therefore, the ion source apparatus in accordance with the present invention is convenient in operation. And the ion source apparatus in accordance with the present invention would not produce particles, so that the cleaning process of the ion source apparatus is convenient.

In summary, the advantages of the present invention include the follows.

1. To clean the ion source apparatus, the user only needs to take out the guiding block 40 and the heat dissipating base 20 from the body 10. Therefore, the ion source apparatus in accordance with the present invention is convenient to clean.

2. The guiding block 40 is provided on the heat dissipating base 20 through the at least two supporting shafts 30, so that the first heat dissipating plate 22 and the second heat dissipating plate 23 are not securely combined with the guiding block 40, and the particles are not generated, and the chances of short circuits are drastically reduced.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An ion source apparatus comprising:
   a body having
      a holding chamber formed inside the body;
   a heat dissipating base located in the holding chamber of the body and having
      a transmitting element mounted in the holding chamber;
      a first heat dissipating plate located under the transmitting element and being an annular disk; and
      a second heat dissipating plate mounted on a top surface of the transmitting element, and being an annular disk;
   at least two supporting shafts mounted through the heat dissipating base, each one of the at least two supporting shafts having:
      a base portion made of ceramics;
      an abutting portion made of copper, and abutting a top surface of the base portion, and the abutting portion of each supporting shaft extending out of a top surface of the second heat dissipating plate; and
      a guiding wire mounted at a bottom portion of the supporting shaft;
   a guiding block mounted on the at least two supporting shafts, and being a hollow circular block; and
   a shunt located at a center of the top surface of the second heat dissipating plate, and located below the guiding block.

2. The ion source apparatus as claimed in claim 1, wherein the transmitting element has
   at least two guiding holes formed through the transmitting element at spaced intervals;
the first heat dissipating plate has
   at least two bottom holes formed through the first heat dissipating plate at spaced intervals;
the second heat dissipating plate has
   at least two top holes formed through the second heat dissipating plate at spaced intervals, and the at least two top holes located respectively above the at least two guiding holes, and the at least two supporting shafts respectively mounted through the at least two guiding holes of the transmitting element, the at least two bottom holes of the first heat dissipating plate, and the at least two top holes of the second heat dissipating plate.

3. The ion source apparatus as claimed in claim 2, wherein the guiding block has at least two mounting holes formed in a bottom surface of the guiding block, and the positions of the at least two mounting holes are corresponding to the at least two supporting shafts respectively.

4. The ion source apparatus as claimed in claim 3, wherein the guiding block has a mounting recess formed in a center of the bottom surface of the guiding block, and the shunt is located below the mounting recess.

5. The ion source apparatus as claimed in claim 3, wherein the guiding block has a locking hole formed through a top surface of the guiding block and communicating with one of the at least two mounting holes, and a bolt is mounted through the locking hole and is screwed with one of the at least two supporting shafts.

6. The ion source apparatus as claimed in claim 4, wherein the guiding block has a locking hole formed through a top surface of the guiding block and communicating with one of the at least two mounting holes, and a bolt is mounted through the locking hole and is screwed with one of the at least two supporting shafts.

7. The ion source apparatus as claimed in claim 5, wherein the body further has
- a base element located inside the holding chamber, being an annular disk, and having
  - at least two through holes formed through the base element at spaced intervals; and
- an assembling element mounted on a top surface of the base element, being an annular disk, and having
  - at least two assembling holes formed through the assembling element at spaced intervals, and the supporting shafts mounted through the at least two through holes and the at least two assembling holes.

8. The ion source apparatus as claimed in claim 6, wherein the body further has
- a base element located inside the holding chamber, being an annular disk, and having
  - at least two through holes formed through the base element at spaced intervals; and
- an assembling element mounted on a top surface of the base element, being an annular disk, and having
  - at least two assembling holes formed through the assembling element at spaced intervals, and the supporting shafts mounted through the at least two through holes and the at least two assembling holes.

* * * * *